United States Patent [19]

Fujita

[11] Patent Number: 5,747,797

[45] Date of Patent: May 5, 1998

[54] ROTATION INFORMATION DETECTING APPARATUS AND SCALE FOR USE IN THE SAME

[75] Inventor: Muneo Fujita, Utsunomiya, Japan

[73] Assignee: Canon Kabushiki Kaisha, Tokyo, Japan

[21] Appl. No.: 625,707

[22] Filed: Apr. 3, 1996

[30] Foreign Application Priority Data

Apr. 5, 1995 [JP] Japan .................................. 7-104825

[51] Int. Cl.$^6$ .................................................. G01D 5/34
[52] U.S. Cl. ............................ 250/231.14; 250/231.18; 356/356
[58] Field of Search .................... 250/237 G, 231.1 H, 250/231.18, 559.37; 356/356, 358; 341/11, 13

[56] References Cited

U.S. PATENT DOCUMENTS

| | | | |
|---|---|---|---|
| 5,003,171 | 3/1991 | Paley | 250/231.14 |
| 5,126,562 | 6/1992 | Ishizuka et al. | 250/231.14 |
| 5,323,001 | 6/1994 | Igaki et al. | 250/231.16 |

FOREIGN PATENT DOCUMENTS

| | | | |
|---|---|---|---|
| 4130221 | 5/1992 | Japan . | |

Primary Examiner—Que Le
Attorney, Agent, or Firm—Fitzpatrick, Cella, Harper & Scinto

[57] ABSTRACT

A rotation information detecting apparatus has a scale having a cylinder or a disc member with a grating portion provided over the entire circumference thereof, and a light projecting unit for applying a light beam to the grating portion. The apparatus also includes a fist light receiving unit, having at least one sensor, disposed to receive a light beam from the light projecting unit which has passed through first and second areas of the grating portion or a grating portion provided on another member. The incremental relative rotation information between the scale and a unit including the light projecting unit and the first light receiving unit is obtained by the light reception of the first light receiving unit. The apparatus also includes a plurality of inclined faces provided substantially over the entire circumference of the scale, each of the inclined faces having an angle of inclination differing from that of the adjacent inclined face, and a second light receiving unit having at least one sensor, the second light receiving unit receiving a light beam from the light projecting unit which is reflected or refracted by at least one of the inclined faces. The absolute rotation position information of the scale relative to the light projecting unit and the second light receiving unit is obtained by the light reception of the second light receiving unit.

26 Claims, 7 Drawing Sheets

FIG. 9
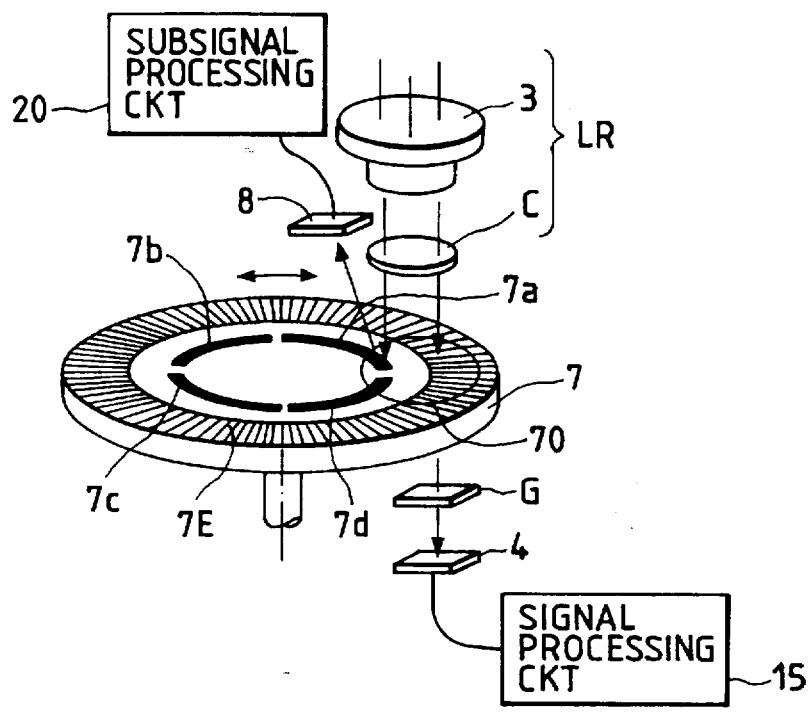
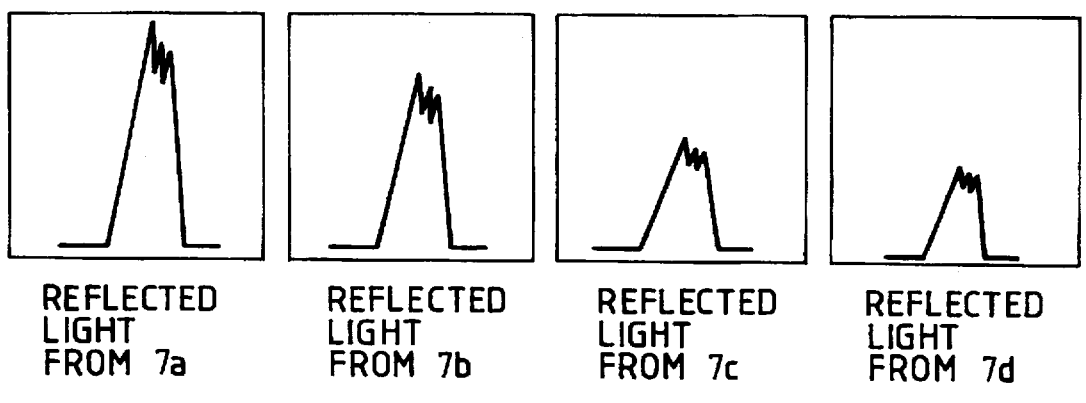
FIG. 10A  FIG. 10B  FIG. 10C  FIG. 10D
REFLECTED LIGHT FROM 7a | REFLECTED LIGHT FROM 7b | REFLECTED LIGHT FROM 7c | REFLECTED LIGHT FROM 7d FIG. 12A — REFLECTED LIGHT FROM 9a
FIG. 12B — REFLECTED LIGHT FROM 9b
FIG. 12C — REFLECTED LIGHT FROM 9c
FIG. 12D — REFLECTED LIGHT FROM 9d

ROTATION INFORMATION DETECTING APPARATUS AND SCALE FOR USE IN THE SAME

BACKGROUND OF THE INVENTION

1. Field of the Invention

This invention relates to an optical scale and a rotation information detecting apparatus such as a rotary encoder using the same, and particularly has a mechanism for detecting the absolute positional information of an optical type scale (rotating object) by the utilization of diffraction or Talbot interference, and is suitable for detecting the rotation information of the optical type scale highly accurately.

2. Related Background Art

Heretofore, an encoder as a displacement sensor for detecting a position or an angle has been used in an NC machine tool or the like. Particularly, a rotary encoder is simple in construction and yet can detect an amount of angular displacement highly accurately and therefore is widely used in machine tools and measuring apparatuses.

FIGS. 1A and 1B of the accompanying drawings, are schematic views of the essential portions of a rotary encoder disclosed in Japanese Laid-Open Patent Application No. 4-130221 and U.S. Patent No. 5,323,001 (corresponding to Japanese Laid-Open Patent Application No. 4-130221). This rotary encoder applies the principle of Talbot interference thereto and measures the amount of rotation of a rotating object by the use of a cylindrical optical scale.

In FIGS. 1A and 1B, the reference numeral 11 designates a light source which is constructed, for example, of a semiconductor laser and emits a coherent light beam of a wavelength $\lambda$. The reference numeral 12 denotes a collimator lens system which converts a divergent light beam from the semiconductor laser 11 into a parallel light beam. The semiconductor laser 11 and the collimator lens 12 each constitute an element of light applying means.

The reference numeral 13 designates an optical scale (scale) which has a grating portion comprising gratings of a predetermined period provided on the circumference of a cylinder member and is mounted on the rotary shaft of a rotating object and is rotated in one of directions indicated by bilateral arrow. The whole or at least a part of the scale 13 comprises a grating portion formed of a light transmitting optical material, and a number of V-grooves are arranged at equal intervals on the inner side of the grating portion along the entire circumference in the cylindrical direction thereof.

The reference characters 14a, 14b and 14c denote photodetectors constituting light receiving means and disposed at a location opposed to the light applying means with the scale 13 interposed therebetween. The output from each photodetector is output to a signal processing circuit 15. The signal processing circuit 15 has a pulse counting circuit, a rotation direction discriminating circuit, a signal interpolation processing circuit, etc.

The detecting action of the rotation information of the prior-art rotary encoder will now be described. The light beam from the light source 11 is converted into a convergent light beam by the collimator lens system 12 and enters a first scale (first area) 31 of the optical scale 13.

Of this convergent light beam, a light beam arriving at the range of two inclined faces forming the V-grooves on the grating portion in the first area 31 is reflected without travelling into the cylinder member, and only a light beam having arrived at the flat portion of the grating portion travels into the cylinder member. That is, in the first area 31, the V-groove type grating has an action similar to that of a transmitting type amplification diffraction grating.

The light beam is diffracted by the grating portion in this first area 31, and diffracted lights of 0-order, ±1st-order, ±2nd-order, ... are created by the action of the grating, and as a result of the interference between, two or three light beams of 0-order light and ±1st-order lights, the Fourier image of the grating in the first area 31 is imaged in the interior of the optical scale 13. The Fourier image is repetitively formed rearwardly of the grating surface at a location integer times a distance L, and the wavelength $\lambda$ of the light source, the grating pitch P and the location of the collimator lens system 12 are set so that for example, the third (N=3) Fourier image may be formed on the grating surface in a second area 32. The light-and-shade pitch of this Fourier image becomes equal to the pitch P of the V-grooves which are the gratings in the first area 31 and the second area 32.

A light beam having entered the second area 32 is diffracted in three different directions by the flat portion of the grating portion and the inclined face portions of two V-grooves, and arrives at the detectors 14a, 14b and 14c. That is, in the second area 32, the V-groove grating functions as a light wave front dividing element.

When the optical scale 13 is rotated, the balance of the quantities of light entering the photodetectors 14a, 14b and 14c varies in conformity with the relative displacement of the changing position of the grating and the position of the Fourier image and as a result, assuming that the optical scale 13 is rotated counter-clockwisely, there is obtained a variation in quantity of light (signal) as shown in FIG. 1C of the accompanying drawings.

In FIG. 1C, the axis of abscissas represents the amount of rotation of the optical scale 13 and the axis of ordinates represents the quantities of received light of the photodetectors 14a, 14b and 14c. The signals a, b and c of FIG. 1C correspond to the photodetectors 14a, 14b and 14c, respectively. When the optical scale 13 is rotated clockwisely, the signal a is the output of the photodetector 14b, the signal b is the output of the photodetector 14a and the signal c is the output of the photodetector 14c. By this difference, the direction of rotation of the optical scale 13 can be discriminated. Also, incremental rotation information is obtained by the periodic counting of these periodic signals.

The signal processing circuit 15 uses these signals a, b and c to obtain rotation information such as the angle of rotation and amount of rotation or the rotational speed and rotational acceleration of the optical scale 13 (rotating object).

With the tendency toward the higher resolving power of the incremental type encoder, the advent of an incremental type encoder having the function of detecting the positions of magnetic poles has also come to be desired in AC servo-motors.

SUMMARY OF THE INVENTION

It is an object of the present invention to provide an optical scale suitable for a rotation information detecting apparatus such as, an incremental type rotary encoder or the like provided with the so-called absolute function, and a rotation information detecting apparatus using the same.

Other objects of the present invention will become apparent from the following description of some embodiments of the invention.

BRIEF DESCRIPTION OF THE DRAWINGS

FIG. 9 is a schematic view of the essential portions of Embodiment 3 of the present invention.

FIGS. 10A, 10B, 10C and 10D are illustrations of the signals of reflected lights from respective reflecting zones in Embodiment 3.

FIGS. 12A, 12B, 12C and 12D are illustrations of the signals of reflected lights from respective reflecting zones in Embodiment 4.

DESCRIPTION OF THE PREFERRED EMBODIMENTS

Figure 1A:
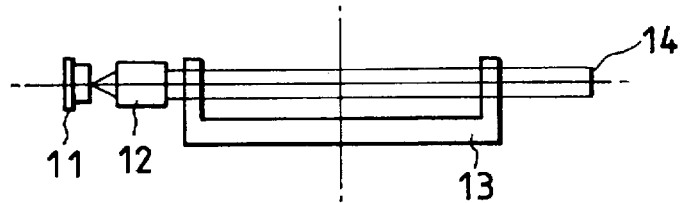
FIGS. 1A and 1B are schematic views of the essential portions of a rotary encoder according to the prior art.
Figure 1B:
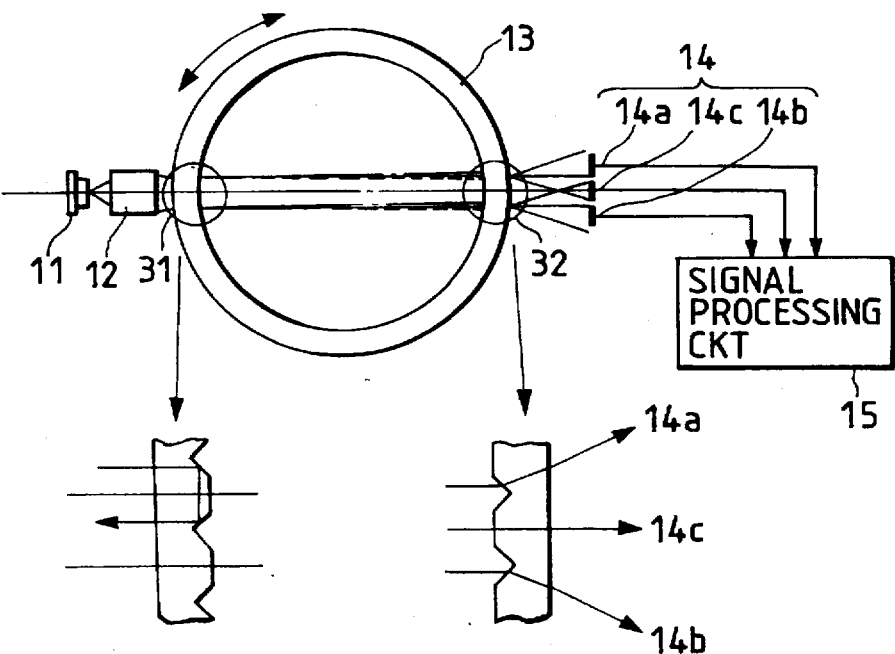
Figure 1C:
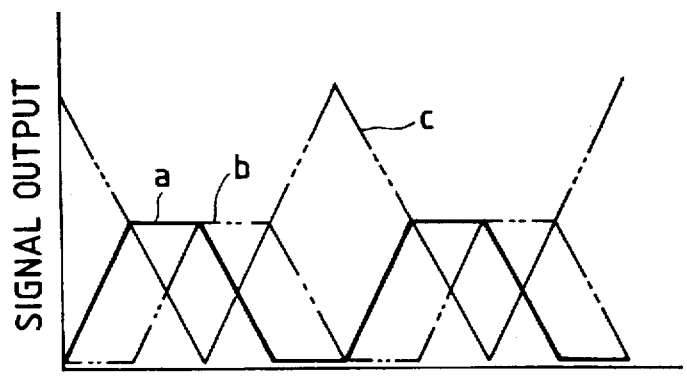
FIG. 1C is an illustration of a signal output in an example of the prior art.
Figure 2A:
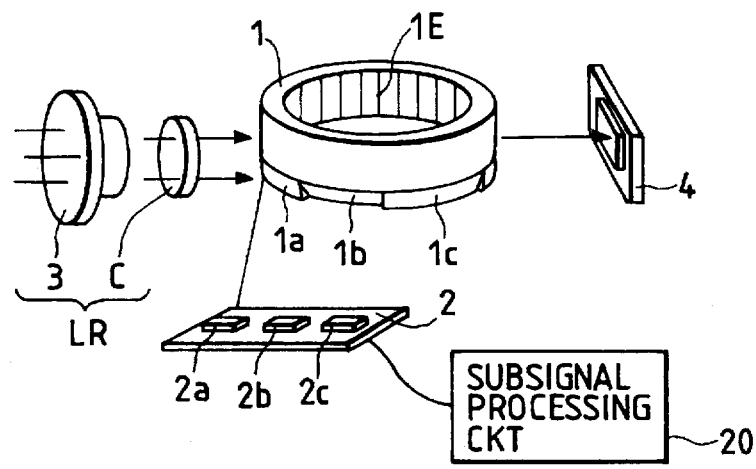
FIG. 2A is a perspective view of the essential portions of Embodiment 1 of the present invention.
Figure 2B:
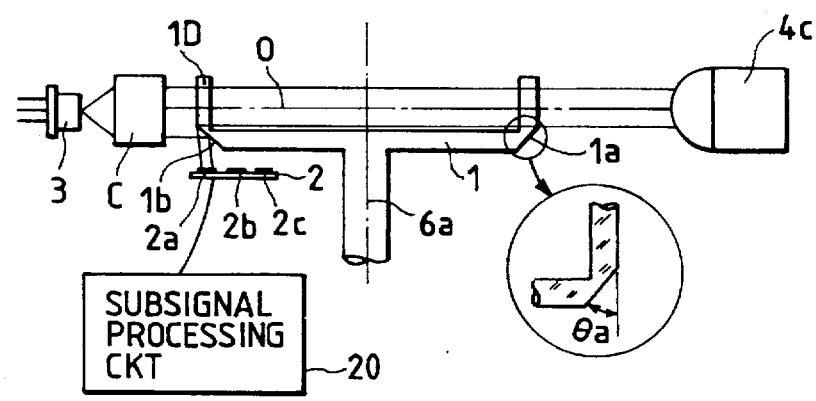
FIGS. 2B and 2C are schematic views of the essential portions of Embodiment 1 of the present invention.
Figure 2C:
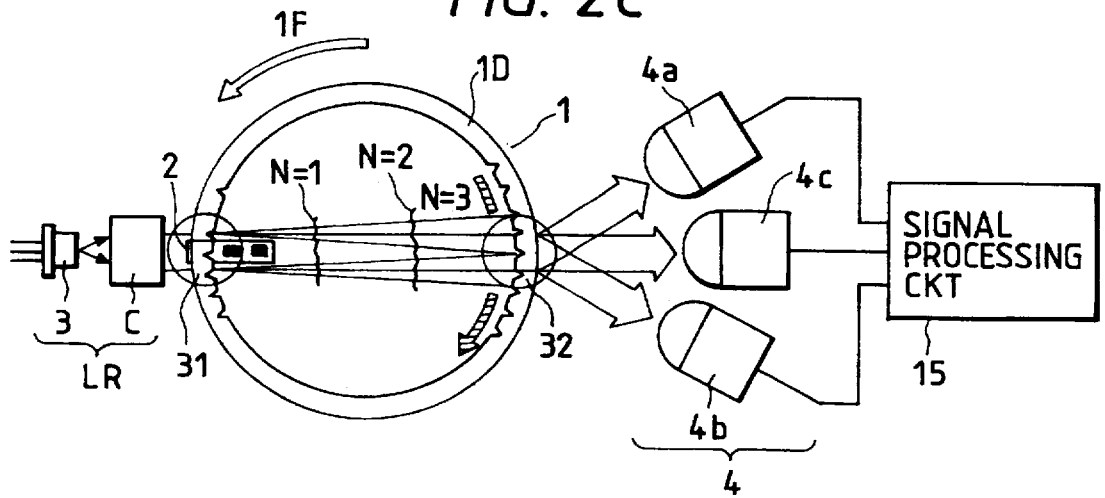

FIG. 2A is a perspective view of the essential portions of Embodiment 1 of the present invention. FIGS. 2B and 2C are schematic views of the essential portions of Embodiment 1, FIG. 2B being a central cross-sectional view, and FIG. 2C being a plan view.

In FIGS. 2A to 2C, the reference numeral 3 designates a light source comprised, for example, of a semiconductor laser and emitting a coherent light beam of a wavelength $\lambda$. The letter C denotes a collimator lens system, and the light source 3 and the collimator lens system C each constitute an element of light applying means LR.

The reference numeral 1 designates an optical scale. A grating portion 1E formed with a grating of a predetermined period of a grating pitch P is provided on the inner peripheral surface or the outer peripheral surface of the cylinder portion (cylinder member) 1D of the optical scale 1. The optical scale 1 is formed of a light transmitting optical material, for example, polycarbonate resin, and is mounted on a portion of a rotating object (not shown), and is rotated about a rotary shaft 6a with the rotating object.

Figure 3A:
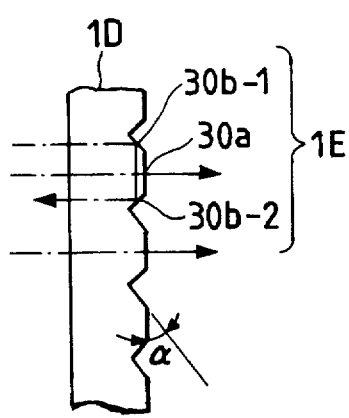
FIGS. 3A and 3B are illustrations of the grating portion of Embodiment 1.
Figure 3B:
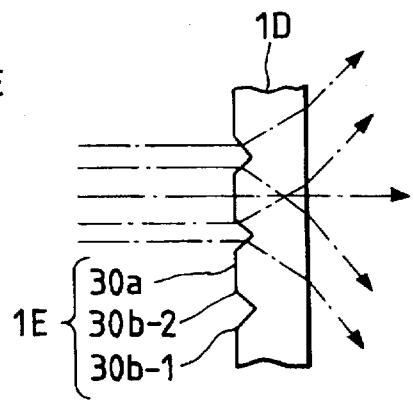

The grating portion 1E, as shown in FIG. 3A and 3B is long in a direction (the direction of the rotary shaft 6a) perpendicular to the direction of rotation of the optical scale 1 indicated by arrow 1F, and comprises V-grooves (V-groove portion) having two inclined faces inclined in opposite directions and a curved surface portion (hereinafter referred to as the "flat surface portion") approximate to a substantially flat surface having a slight curvature based on a cylindrical surface.

Referring to FIGS. 3A and 3B which are detailed views of the grating of the optical scale 1, V-groove portions 30b-1, 30b-2 and flat surface portions 30a are alternately arranged to thereby form a grating. On the inner side of the cylinder portion 1D, n V-grooves are arranged at equal intervals and at a pitch P in the circumferential direction. The width of the V-grooves is ½·P, and the two flat surface portions forming a V-groove each have a width of ¼·P, and each inclined face is inclined by a critical angle or greater, in the present embodiment, $\alpha$=45°, with respect to a straight line linking the bottom and center of the V-groove together.

The interval D between a first scale (first area) 31 and a second scale (second area) 32 of the optical scale 1 along an optical axis 0 (the diameter of the inside of the optical scale), in the present embodiment, with the grating pitch as P and the wavelength as $\lambda$, is set so as to satisfy:

$D = N \cdot P^2/\lambda$ (N being a natural number)

$P = \pi D/n$ (n being the total number of slits (V-grooves)).

By the diameter D of the optical scale 1 being thus set, the image of the grating in the first area 31 on the side of the optical scale 1 is directly projected onto the grating in the second area 32. Here, the grating image projected is what is called a Fourier image, and is created by the self-imaging action of the grating resulting from a light diffraction phenomenon.

In the present embodiment, the material of the optical scale 1 is plastic so that it can be easily made by a manufacturing method such as injection molding or compression molding.

The reference numeral 4 designates a main signal light receiving portion (first light receiving means) disposed at a location opposed to the light source 3 with the optical scale 1 interposed therebetween. The main signal light receiving portion 4 has a plurality of photodetectors (first light receiving elements) 4a, 4b and 4c, and the output from each of these photodetectors is output to a signal processing circuit 15. The signal processing circuit 15 has a pulse counting circuit, a rotational direction discriminating circuit, a signal interpolation processing circuit, etc., and uses a signal from the main signal light receiving portion 4 to detect the incremental rotation information of the optical scale 1.

Also, on the lower end of the cylinder portion of the optical scale 1, the entire circumference of the cylinder portion is divided into three sections to thereby form inclined faces (reflecting surfaces) 1a, 1b and 1c (a plurality of areas). These inclined faces are inclined faces of angles $\theta a$, $\theta b$ and $\theta c$, respectively, in a plane containing the rotary shaft 6a.

Figure 6:
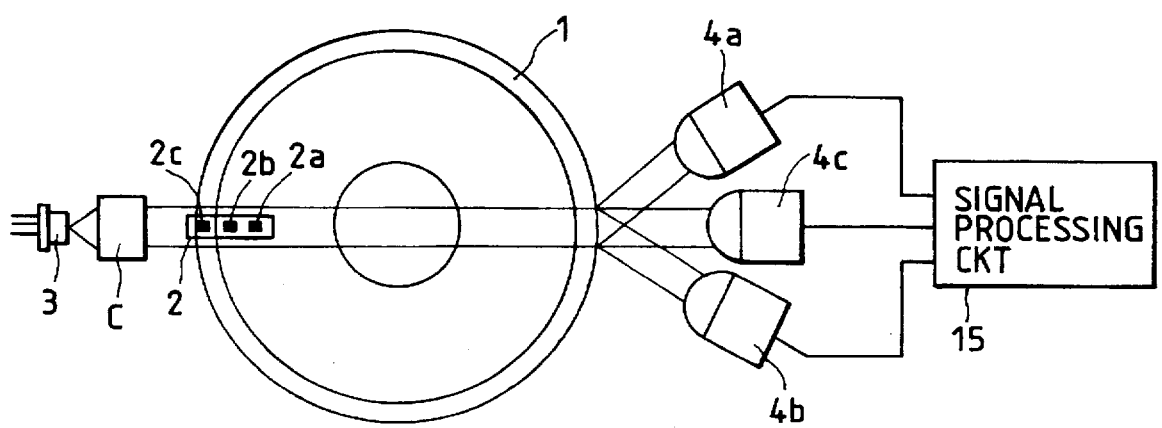
FIG. 6 is an illustration of the arrangement of the optical scale and subsignal light receiving portion of Embodiment 1.

The reference numeral 2 denotes a subsignal light receiving portion (second light receiving means) comprised of a plurality of sensors (second light receiving elements) 2a, 2b and 2c disposed on a base plate, and installed below the inclined face of the optical scale 1 as shown in FIG. 6. The reference numeral 20 designates a subsignal processing circuit which receives a signal from the second light receiving means and judges which reflecting surface the light beam is irradiating, and outputs the result as an absolute position signal. The second light receiving means 2 and the subsignal processing circuit 20 each constitute an element of absolute position detecting means.

Description will now be made of the action of detecting the rotation information of the optical scale 1 (rotating object) of the present embodiment.

The light beam from the light source 3 is converted into convergent light by the collimator lens system C and enters the first scale (first area) 31 of the optical scale 1. The reason why the light beam is converted into convergent light is that the side surface of the optical scale 1 has refractive power equivalent to that of a concave lens due to the curvature difference between the outer side and the inner side, and by this concave lens action, the light beam having entered the interior of the optical scale 1 becomes substantially parallel light.

This convergent light beam is such that in the first area 31 of the grating portion 1E, as shown in FIG. 3A, rays of light having arrived at the flat surface portions 30a pass through these portions 30a and travel into the cylinder. Also, a ray of light having arrived at the surface of the portion 30b-1 of the inclined face is totally reflected and directed to the surface 30b-2 as shown because the inclined face of this portion is set to a critical angle or greater, and thus it is totally reflected also on this surface 30b-2 and therefore, after all, the ray of light having arrived at the surface 30b-1 does not enter the interior of the cylinder portion of the optical scale 1 but is returned substantially in the direction of incidence. Likewise, the ray of light having arrived at the surface 30b-2 repeats total reflection and is returned.

Accordingly, the light beam arriving at the range of the two inclined faces 30b-1 and 30b-2 forming a V-groove in the first area 31 is reflected without entering the cylinder member, and only the rays of light having arrived at the grating portion 30a travel into the interior of the cylinder member. That is, in the first area 31, the grating portion 1E has action similar to that of a transmitting type amplification diffraction grating.

The light beam is diffracted in the first area 31 of this grating portion 1E, and diffracted lights of 0-order, ±1st-order, ±2nd-order, . . . are created by the action of the grating, and as a result of the interference between two or three light beams of 0-order and ±1st-order, the Fourier image of the grating of the first area 31 is formed in the interior of the optical scale 1. The Fourier image is repetitively formed rearwardly of the grating surface at a location integer times a distance L.

In the present embodiment, the wavelength λ of the light beam from the light source, the grating pitch P and the location of the collimator lens system C are set so that the third (N=3) Fourier image may be formed on the grating surface of the second area 32 of the grating portion 1E. The light-and-shade pitch of this Fourier image becomes equal to the pitch P of the V-grooves in the first area 31 and the second area 32.

The light beam having entered the surface 30a in the second area 32 enters substantially perpendicularly thereto as shown in FIG. 3B and therefore is transmitted straight through and arrives at the photodetector 4c. Also, rays of light having arrived at the two inclined faces 30b-1 and 30b-2 forming a V-groove enter each surface at an angle of incidence of about 45° and therefore are greatly refracted in different directions and arrive at the detectors 4a and 4b, respectively. Thus, in the second area 32, the light beams travel separately in three directions due to the two inclined faces inclined in different directions with respect to the incident light beam and the flat surface between the V-groove and the V-groove, thus totalling three surfaces differing in the direction of inclination, and arrive at the photodetectors 4a, 4b and 4c provided at locations corresponding to the respective surfaces. That is, in the second area 32, the V-grooves grating functions as a light wave front dividing element.

Here, when the optical scale 1 is rotated, the quantities of light detected by the photodetectors 4a, 4b and 4c vary. The balance between the quantities of light entering the respective photodetectors varies in conformity with the relative displacement of the position of the grating and the position of the Fourier image and as a result, assuming that the optical scale 1 is rotated counter-clockwise, there is obtained a variation in the quantity of light as shown in FIG. 4A.

Figure 4A:
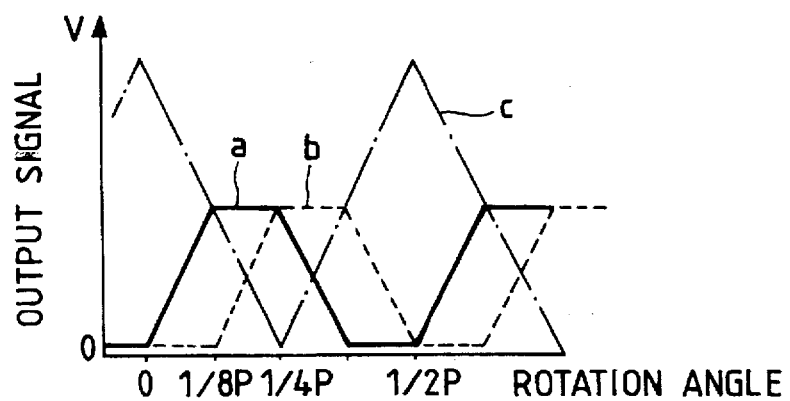
FIGS. 4A and 4B are illustrations of the signal of the main signal detecting portion of Embodiment 1.

In FIG. 4A, the abscissa represents the amount of rotation of the optical scale 1 and the ordinate represents the quantity of received light. Signals a, b and c correspond to the signals from the photodetectors 4a, 4b and 4c, respectively. When conversely, the optical scale 1 is rotated clockwise, the signal a is the output of 4b, the signal b is the output of 4a, and the signal c is the output of 4c. By this difference, the direction of rotation can be discriminated. Also, by the periodic counting of this periodic signal, the angle of rotation or the amount of rotation or the like can be incrementally detected.

Figure 4B:
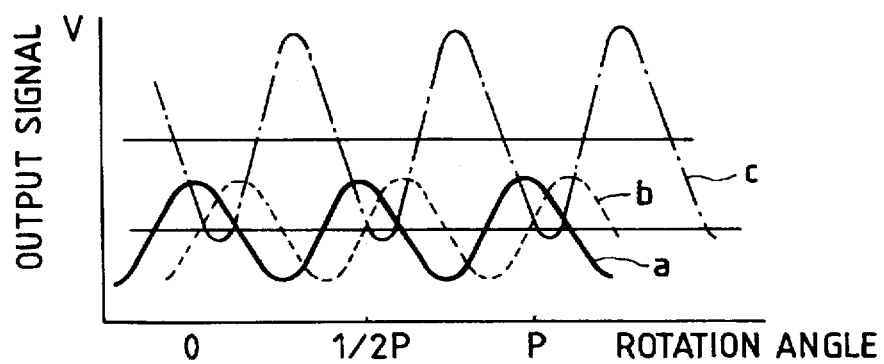

FIG. 4A shows the state of a theoretical variation in the quantity of light when the contrast of the Fourier image is very high and nearly ideal, and actually, the contrast of the Fourier image is lower and therefore, as shown in FIG. 4B, each quantity of light varies in the form of a substantially sine wave. The signal processing circuit 15 incrementally obtains rotation information such as the angle of rotation and the amount of rotation or the rotational speed and the rotational acceleration of the optical scale 1 (rotating object) on the basis of these signals.

Figure 5A:
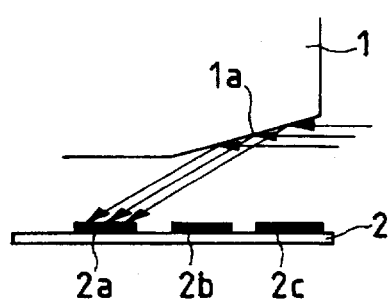
FIGS. 5A, 5B and 5C are illustrations of the subsignal detection of Embodiment 1.
Figure 5B:
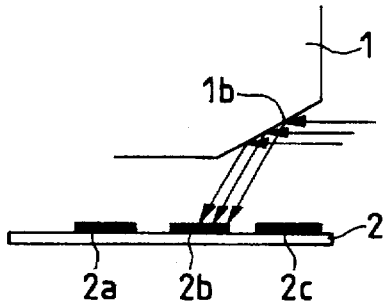
Figure 5C:
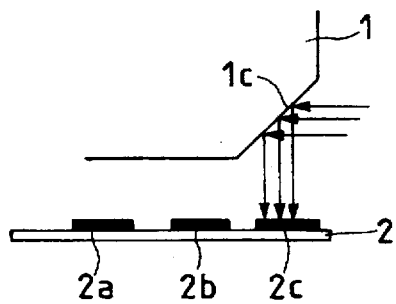

Description will now be made of the action of detecting the absolute position of the optical scale 1. The light beam emitted from the light applying means LR is reflected on the inclined faces 1a, 1b and 1c of the optical scale 1 and arrives at the subsignal light receiving portion 2. At that time, the inclined faces 1a, 1b and 1c differ in angle from one another and therefore, as shown in FIGS. 5A, 5B and 5C, the reflected lights separately enter the sensors 2a, 2b and 2c of the subsignal light receiving portion 2 in conformity with the inclined faces 1a, 1b and 1c. The subsignal processing circuit 20 receives the signals from these sensors and detects which sensor the reflected light has entered, whereby even during the starting of the encoder, the absolute position of the optical scale 1 (the position of each reflecting surface) can be detected.

When for example, in an AC servo-motor, the number of magnetic poles is three, the present embodiment is connected to the rotor of the motor, whereby even during the starting of the AC servo-motor, the absolute positional relationship of the optical scale 1 can be known and from this, the positional relationship among the magnetic poles can be detected, and an electric current can be supplied appropriately.

Figure 7:
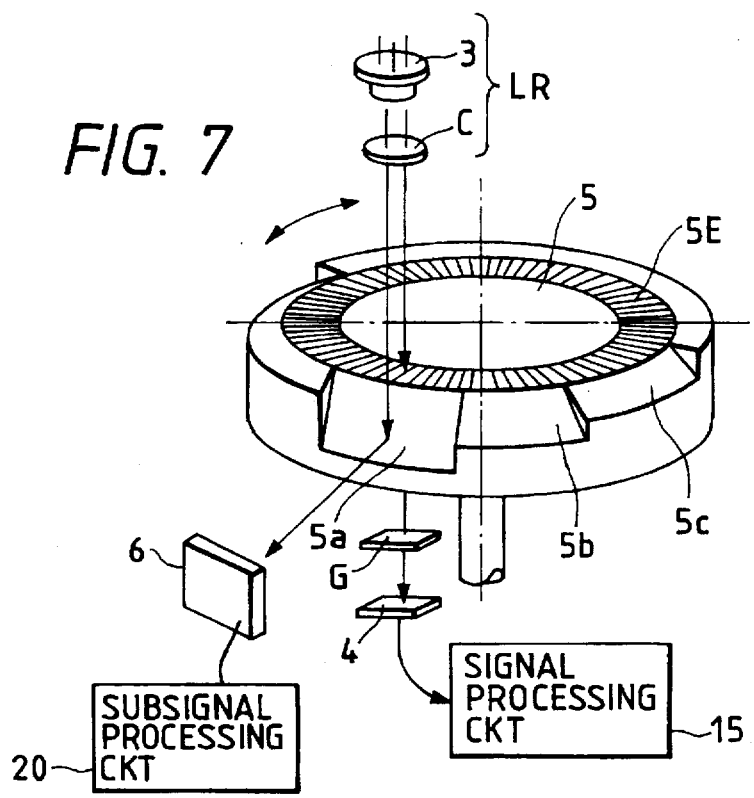
FIG. 7 is a schematic view of the essential portions of Embodiment 2 of the present invention.

FIG. 7 is a schematic view of the essential portions of Embodiment 2 of the present invention. This embodiment is one in which the present invention is applied to a rotary encoder using a flat disc-like optical scale.

In FIG. 7, the reference numeral 3 designates a light source comprised, for example, of a semiconductor laser and emitting a coherent light beam of a wavelength λ. The letter C denotes a collimator lens system, and the light source 3 and the collimator lens system C each constitute an element of light applying means LR.

The reference numeral 5 designates an optical scale having a grating portion 5E formed with radial gratings along one circumference of a disc member, and rotated in one of directions indicated by a bilateral arrow. The optical scale 5 (a comma) or at least its grating portion 5E, is formed of a light transmitting optical material, and a number of V-grooves are radially and equiangularly arranged on one surface of the grating portion 5E along one circumference thereof.

Figure 8A:
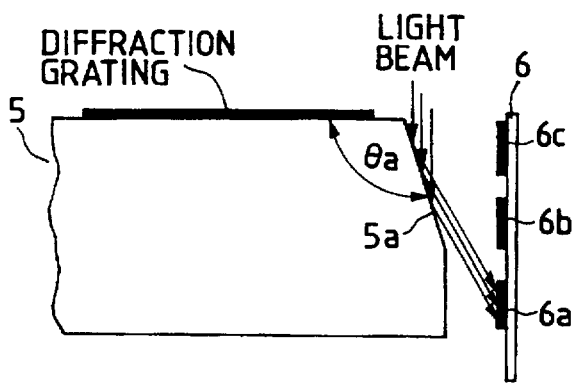
FIGS. 8A, 8B and 8C are illustrations of the subsignal detection of Embodiment 2.
Figure 8B:
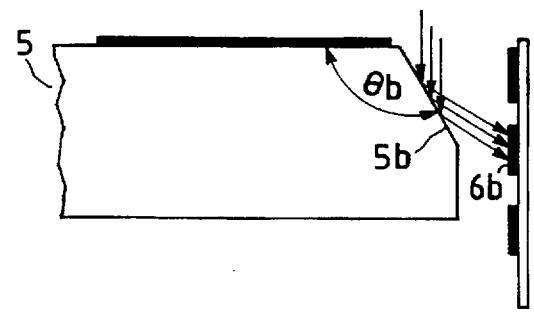
Figure 8C:
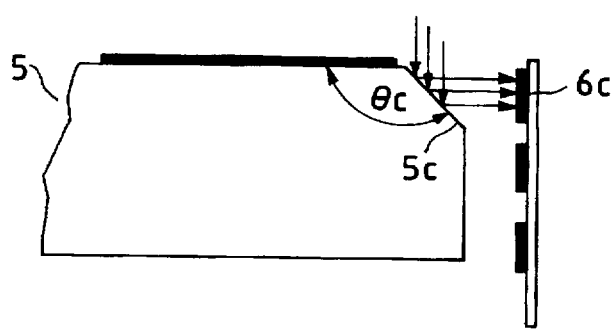

Along a plurality of inclined face (reflecting surfaces) 5a, 5b, 5c, . . . (a plurality or areas) are formed on the edge of the disc member of the optical scale 5. These inclined faces, as shown in FIGS. 8A to 8C, are inclined faces of angles θa, θb, θc, . . . , respectively, in a plane containing the rotary shaft.

The letter G denotes a fixed diffraction grating of which the shape and pitch are the same as those of the grating portion 5E of the optical scale 5. The reference numeral 4 designates a main signal light receiving portion (first light receiving means). The main signal light receiving portion 4 has a plurality of photodetectors (first light receiving elements), and an output from each photodetection is outputted to a signal processing circuit 15. The signal processing circuit 15 has a pulse counting circuit, a rotational direction discriminating circuit, a signal interpolation processing circuit, etc.

The reference numeral 6 denotes a subsignal light receiving portion (second light receiving means) which is comprised of a plurality of sensors (second light receiving elements) 6a, 6b, 6c, . . . disposed on a base plate and is installed laterally of the disc member of the optical disc 5 as shown in FIG. 7. The reference numeral 20 designates a subsignal processing circuit which receives signals from the second light receiving means 6 and judges which reflecting surface the light beam is irradiating, and outputs the result as an absolute position signal. The second light receiving means 6 and the subsignal processing circuit 20 each constitute an element of absolute position detecting means.

Of the above-described elements, the light applying means LR, the fixed diffraction grating G, the main signal light receiving portion 4, the signal processing circuit 15, the subsignal light receiving portion 6, etc. are installed on a housing.

Description will now be made of the action of detecting the rotation information of the optical scale 5 of the present embodiment. The light beam from the light source 3 is converted into a parallel light beam by the collimator lens system C and irradiates a portion (first area) of the grating portion 5E of the optical scale 5.

This parallel light beam is diffracted by the action of the amplification diffraction grating of the grating portion 5E. The Fourier image of the grating of the irradiated area (first area) is formed rearwardly of the optical scale 5. The Fourier image is repetitively formed rearwardly of the grating surface at a location integer times a distance L. In the present embodiment, the wavelength λ of the light source, the grating pitch P and the location of the collimator lens system C are set so that the Nth Fourier image may be formed on the grating surface of the fixed diffraction grating G. The light-and-shade pitch of this Fourier image becomes equal to the pitch P of the V-grooves on the grating portion 5E.

As in Embodiment 1, the light beam having entered the fixed diffraction grating G has its light wave front divided here and separates into a plurality of light beams, which arrive at photodetectors corresponding thereto, respectively.

Here, when the optical scale 5 is rotated, the quantity of light detected by each photodetector varies as in Embodiment 1, and by the signal thereof, the signal processing circuit 15 incrementally obtains rotation information such as the angle of rotation and the amount of rotation or the rotational speed and the rotational acceleration of the optical scale 5 (rotating object).

Description will now be made of the action of detecting the absolute position of the optical scale 5. Part of the parallel light emitted from the light applying means LR is reflected on the inclined faces 5a, 5b, 5c, . . . of the optical scale 5 and arrives at the subsignal light receiving portion 6. At that time, the reflected lights separately enter the sensors 6a, 6b, 6c, . . . of the subsignal light receiving portion 6 in conformity with the inclined faces 5a, 5b, 5c, . . . as shown in FIGS. 8A, 8B and 8C because the inclined faces 5a, 5b, 5c, . . . differ in angle from one another. The subsignal processing circuit 20 receives signals from these sensors and detects which sensor the reflected light has entered, whereby the absolute position of the optical scale 5 (the position of each reflecting surface) can be detected even during the starting of the encoder.

When for example, in an AC servo-motor, the number of magnetic poles is three, the present embodiment in which the edge of the disc of the optical scale 5 is divided into three to provide the inclined faces 5a, 5b and 5c is connected to the rotor of the motor. Thereby, the absolute positional relationship of the optical scale 5 can be known even during the starting of the AC servo-motor and from this, the positional relationship among the magnetic poles can be detected and a power source switch can be closed appropriately.

While in the present embodiment, with the inclined faces 5a, 5b and 5c as reflecting faces, the incident light beam is reflected and the absolute position of the optical scale 5 is detected, design can also be made such that with the inclined faces 5a, 5b and 5c as transmitting surfaces, the absolute position of the optical scale 5 is detected by light beams refracted at different angles by the respective inclined faces.

FIG. 9 is a schematic view of the essential portions of Embodiment 3 of the present invention. This embodiment differs from Embodiment 2 in the construction of the portion for detecting the absolute positional relationship of the optical scale, and in the other points, this embodiment is the same as Embodiment 2. Only the difference of this embodiment from Embodiment 2 will hereinafter be described.

In FIG. 9, the reference numeral 7 designates a disc-like optical scale mounted on the rotary shaft of a rotating object. The optical scale 7 has a grating portion 7E formed with radial gratings on its disc member along a first circumference centering around the rotary shaft, and is rotated in one of directions indicated by bilateral arrow. The optical scale 7, or at least its grating portion 7E, is formed of a light transmitting optical material, and a number of V-grooves are radially and equiangularly arranged on one surface of the grating portion 7E along the first circumference.

Also, on the upper surface of the optical scale 7, there are formed a plurality of reflecting zones (reflecting faces) 7a, 7b, 7c, . . . (a plurality of areas) adjacent to the grating portion 7E along a second circumference centering around the rotary shaft. These reflecting zones 7a, 7b, 7c, . . . are colored with different hues, e.g. red, yellow, blue and black, and differ from one another in the reflectance of light from the light applying means LR.

The reference numeral 8 denotes a subsignal light receiving portion (second light receiving means) which is comprised of a sensor 8a disposed on a base plate, and is installed above the optical scale 7 as shown in FIG. 9 and receives reflected light from the reflecting zones. The reference numeral 20 designates a subsignal processing circuit which receives a signal from the second light receiving means 8 and judges which reflecting surface the light beam is irradiating and outputs the result as an absolute position signal. The second light receiving means 8 and the subsignal processing circuit 20 each constitute an element of absolute position detecting means.

The action of detecting the rotation information of the optical scale 7 of the present embodiment is the same as that of Embodiment 2.

Description will now be made of the action of detecting the absolute position of the optical scale 7. The parallel light emitted from the light applying means LR illuminates the area 70 (first area) of the optical scale 7. The light illuminating the grating portion 7E is transmitted therethrough and is further separated into a plurality of light beams by the fixed diffraction grating G and enters the main signal light receiving portion 4 (first light receiving means) to thereby detect the rotation information of the optical scale.

On the other hand, the light illuminating a part of the reflecting zones of the area 70 on the optical scale 7 is reflected there and arrives at the subsignal light receiving portion 8. At this time, the reflected lights on the reflecting zones 7a, 7b, 7c, . . . differ in intensity from one another due to the differences in the reflectance of these portions as shown in FIGS. 10A, 10B, 10C and 10D. So, the subsignal processing circuit 20 judges the difference in the quantity of reflected light received by the sensor 8a of the subsignal light receiving portion 8, whereby the absolute position of the optical scale 7 (the position of each reflecting surface) can be detected even during the starting of the encoder.

When for example, in an AC servo-motor, the number of magnetic poles is three, the present embodiment in which the second circumference of the optical scale 7 is divided into three to provide the reflecting zones 7a, 7b and 7c is connected to the rotor of the motor. Thereby, the absolute position of the optical scale 7 can be known even during the starting of the AC servo-motor and from this, the positional relationship among the magnetic poles can be detected, and an electric current can be supplied appropriately.

Figure 11:
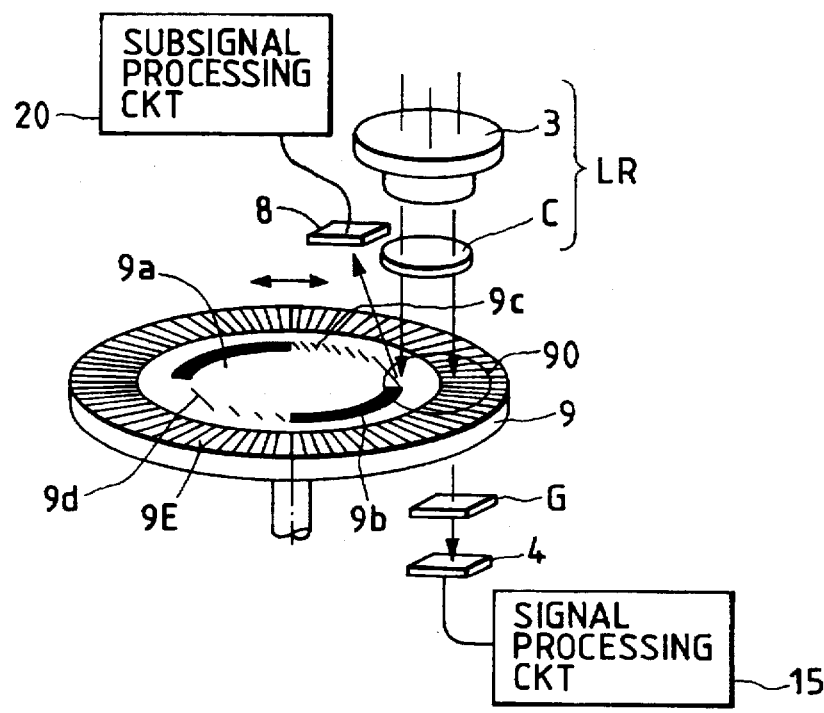
FIG. 11 is a schematic view of the essential portions of Embodiment 4 of the present invention.
Figure 11:
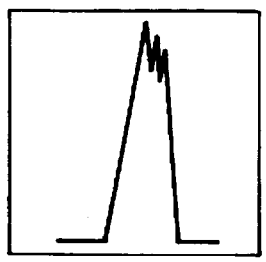
Figure 11:
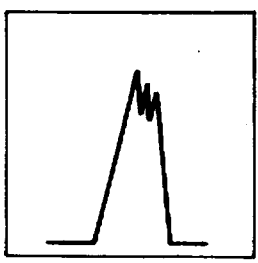
Figure 11:
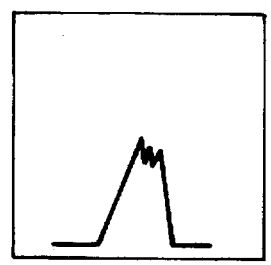
Figure 11:
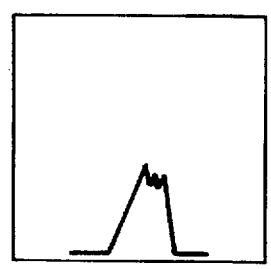

FIG. 11 is a schematic view of the essential portions of Embodiment 4 of the present invention. This embodiment differs from Embodiment 3 in the construction of the portion for detecting the absolute positional relationship of the optical scale, and in the other points, this embodiment is the same as Embodiment 3. Only the difference of this embodiment from Embodiment 3 will hereinafter be described.

In FIG. 11, the reference numeral 9 designates a disc-like optical scale mounted on the rotary shaft of a rotating object. The optical scale 9 has a grating portion 9E formed with radial gratings on its disc member along a first circumference centering around the rotary shaft, and is rotated in one of the directions indicated by bilateral arrow. The optical scale 9 has its whole or at least its grating portion 9E formed of a light transmitting optical material, and a number of V-grooves are radially and equiangularly arranged on one surface of the grating portion 9E along the first circumference centering around the rotary shaft.

Also, on the upper surface of the optical scale 9, there are formed a plurality of reflecting zones (reflecting surfaces) 9a, 9b, 9c, . . . (a plurality of areas) adjacent to the grating portion 9E along a second circumference centering around the rotary shaft. The surfaces of these reflecting zones 9a, 9b, 9c, . . . differ in surface roughness from one another so that the reflectance of the light from the light applying means LR may differ.

In the present embodiment, the action of detecting the rotation information of the optical scale 9 is the same as that in Embodiment 2.

Description will now be made of the action of detecting the absolute position of the optical scale 9. The parallel light emitted from the light applying means LR illuminates the area 90 (first area) of the optical scale 9. The light illuminating the grating portion 9E is transmitted therethrough, and is further separated into a plurality of light beams by the fixed diffraction grating G and enters the main signal light receiving portion (first light receiving means) 4 to thereby detect the rotation information of the optical scale.

On the other hand, the light illuminating a part of the reflecting zones of the area 90 is reflected there and arrives at the subsignal light receiving portion 8. At this time, the reflected lights on the reflecting zones 9a, 9b, 9c, . . . differ in reflectance from one another as shown in FIGS. 12A, 12B, 12C and 12D and therefore, the subsignal processing circuit 20 judges the difference in the quantity of reflected light received by the sensor of the subsignal light receiving portion 8, whereby the absolute position of the optical scale 9 (the position of each reflecting surface) can be detected even during the starting of the encoder.

When for example, in an AC servo-motor, the number of magnetic poles is three, the present embodiment in which the circumference of the optical scale 9 is divided into three to provide the reflecting zones 9a, 9b and 9c is connected to the rotor of the motor. Thereby, the absolute positional relationship of the optical scale 9 can be known even during the starting of the AC servo-motor and from this, the positional relationship among the magnetic poles can be detected, and an electric current can be supplied appropriately.

In Embodiments 3 and 4, the absolute position of the optical scale is detected by the reflecting surfaces differing in reflectance from one another, but alternatively, design can be made such that the portions of the reflecting surfaces are made into transmitting surfaces differing in transmittance from one another and transmitted light beams are detected to thereby detect the absolute position of the optical scale.

As described above, according to the rotary encoder of the present invention, when the power source switch of an AC servo-motor is closed, the positional relationship among the magnetic poles thereof can be detected accurately and a proper electric current can be supplied to each magnetic pole of the motor and thus, the servo-motor can be controlled correctly.

By the construction of the apparatus as described above, in an incremental type rotary encoder, there are achieved an optical scale suitable for an incremental types rotary encoder provided with the so-called absolute function which can detect the absolute position of the optical scale during the starting of the encoder and a rotary encoder using same.

What is claimed is:

1. A rotation information detecting apparatus comprising:

a scale having a cylinder member and a grating portion provided on said cylinder member over an entire circumference thereof;

a light projecting unit for applying a light beam to said grating portion;

a first light receiving unit having at least one sensor, said first light receiving unit being disposed so as to receive a light beam from said light projecting unit which has passed through a first area of said grating portion and a second area of said grating portion, incremental relative rotation information between said scale, and a unit including said light projecting unit and said first light receiving unit being obtained by light reception of said first light receiving unit;

a plurality of inclined surfaces provided substantially over the entire circumference of said scale, each of said inclined faces being adapted such that an angle of inclination thereof differs from that of the inclined face adjacent thereto; and a second light receiving unit having at least one sensor, said second light receiving unit receiving a light beam from said light projecting unit which is one of reflected and refracted by at least one of said plurality of inclined faces, absolute rotation position information of said scale relative to said light projecting unit and said second light receiving unit being obtained by the light reception of said second light receiving unit.

2. The apparatus according to claim 1, said grating portion being provided over the entire circumference of one of an outer surface and an inner surface of said cylinder member.

3. The apparatus according to claim 1, wherein said first light receiving unit receives a light beam from said light projecting unit which has passed through the first area of said grating portion and a grating portion provided on a member discrete from said scale.

4. The apparatus according to claim 1, wherein said first light receiving unit has a plurality of sensors disposed correspondingly to the angles of inclination of said plurality of inclined faces.

5. A rotation information detecting apparatus comprising:

a scale having a cylinder member and a grating portion provided on said cylinder member over an entire circumference thereof;

a light projecting unit for applying a light beam to said grating portion;

a first light receiving unit having at least one sensor, said first light receiving unit being disposed so as to receive a light beam from said light projecting unit which has passed through a first area of said grating portion and a second area of said grating portion, the incremental relative rotation information between said scale, and a unit including said light projecting unit and said first light receiving unit being obtained by light reception of said first light receiving unit;

a plurality of index faces arranged substantially over the entire circumference of said scale, on said index faces there being arranged at least three kinds of index faces differing in one of reflecting, refracting, and transmitting characteristics; and a second light receiving unit having at least one sensor, said second light receiving unit receiving a light beam from said light projecting unit which is one of reflected by, refracted by, and transmitted through at least one of said plurality of index faces, absolute rotation position information of said scale relative to said light projecting unit and said second light receiving unit being obtained by light reception of said second light receiving unit.

6. A rotation information detecting apparatus comprising:

a scale having a disc member and a grating portion provided on said disc member over an entire circumference thereof;

a light projecting unit for applying a light beam to said grating portion;

a first light receiving unit having at least one sensor, said first light receiving unit being disposed so as to receive a light beam from said light projecting unit which has passed through a first area of said grating portion, the incremental relative rotation information between said scale, and a unit including said light projecting unit and said first light receiving unit being obtained by light reception of said first light receiving unit;

a plurality of index faces arranged substantially over the entire circumference of said scale, on said index faces there being arranged at least three kinds of index faces differing in one of reflecting, refracting, and transmitting characteristics; and a second light receiving unit having at least one sensor, said second light receiving unit receiving a light beam from said light projecting unit which is one of reflected by, refracted by, and transmitted through at least one of said plurality of index faces, absolute rotation position information of said scale relative to said light projecting unit and said second light receiving unit being obtained by light reception of said second light receiving unit.

7. A scale to which a light beam from a light projecting unit of a rotation information detecting apparatus is applied and in which a light beam created from the light-applied position is received by a first light receiving unit of said rotation information detecting apparatus, whereby relative rotation information is detected, said scale comprising:

a scale base body having a cylinder member and a grating portion provided on said cylinder member over an entire circumference thereof, said first light receiving unit receiving a light beam from said light projecting unit which has passed through a first area of said grating portion and a second area of said grating portion to obtain incremental relative rotation information between said scale base body, and a unit including said light projecting unit and said first light receiving unit;

a plurality of inclined faces provided substantially over the entire circumference of said scale base body, each of said inclined faces being adapted such that an angle of inclination thereof differs from the angle of inclination of the adjacent inclined face, a second light receiving unit in said rotation information detecting apparatus receiving a light beam from said light projecting unit which is one of reflected and refracted by at least one of said plurality of inclined faces, whereby absolute rotation position information of said scale base body relative to said light projecting unit and said second light receiving unit is obtained.

8. The scale according to claim 7, said grating portion being provided over the entire circumference of one of an outer surface and an inner surface of said cylinder member.

9. A scale to which a light beam from a light projecting unit of a rotation information detecting apparatus is applied and in which a light beam created from the light-applied position is received by a first light receiving unit of said rotation information detecting apparatus, whereby relative rotation information is detected, said scale comprising:

a scale base body having a disc member and a grating portion provided on said disc member over an entire circumference thereof, said first light receiving unit receiving a light beam from said light projecting unit which has passed through a first area of said grating portion to obtain incremental relative rotation information between said scale base body, and a unit including said light projecting unit and said first light receiving unit;

a plurality of inclined faces provided substantially over the entire circumference of said scale base body, each of said inclined faces being adapted such that an angle of inclination thereof differs from the angle of inclination of the adjacent inclined face, a second light receiving unit in said rotation information detecting apparatus receiving a light beam from said light projecting unit which is one of reflected and refracted by at least one of said plurality of inclined faces, whereby absolute rotation position information of said scale base body relative to said light projecting unit and said second light receiving unit is obtained.

10. The scale according to claim 9, said grating portion being provided on the surface of said disc member over the entire circumference thereof.

11. The scale according to claim 9, said grating portion being provided over the entire circumference of one of an outer surface and an inner surface of said disc member.

12. A scale to which a light beam from a light projecting unit of a rotation information detecting apparatus is applied and in which a light beam created from the light-applied position is received by a first light receiving unit of said rotation information detecting apparatus, whereby relative rotation information is detected, said scale comprising:

a scale base body having a cylinder member and a grating portion provided on said cylinder member over an entire circumference thereof, said first light receiving unit receiving a light beam from said light projecting unit which has passed through a first area of said grating portion and a second area of said grating portion to obtain incremental relative rotation information between said scale base body, said light projecting unit, and said first light receiving unit; and a plurality of index faces provided substantially over the entire circumference of said scale base body, on said index faces there being arranged at least three kinds of index faces differing in one of reflecting, refracting, and transmitting characteristics are arranged, a second light receiving unit in said rotation information detecting apparatus receiving a light beam from said light projecting unit which is one of reflected by, refracted by, and transmitted through at least one of said plurality of index faces, whereby absolute rotation position information of said scale base body relative to said light projecting unit and said second light receiving unit is obtained.

13. The scale according to claim 12, wherein said plurality of index faces are adapted such that reflectance of each of said plurality of index faces differs from an adjacent index face, and thereby has a different reflecting characteristic than the adjacent index face.

14. The scale according to claim 12, wherein each of said plurality of index faces differs in hue from an adjacent index face.

15. The scale according to claim 12, wherein each of said plurality of index faces differs in surface roughness from an adjacent index face.

16. The scale according to claim 12, wherein said plurality of index faces are adapted such that an angle of inclination of each of said plurality of index faces differs from an adjacent index face, and thereby has a different reflecting characteristic than the adjacent index face.

17. A rotation information detecting apparatus comprising:

a scale having a disc member and a grating portion provided on said disc member over an entire circumference thereof;

a light projecting unit for applying a light beam to said grating portion;

a first light receiving unit having at least one sensor, said first light receiving unit being disposed so as to receive a light beam from said light projecting unit which has passed through a first area of said grating portion, incremental relative rotation information between said scale, and a unit including said light projecting unit and said first light receiving unit being obtained by light reception of said first light receiving unit;

a plurality of inclined surfaces provided substantially over the entire circumference of said scale, each of said inclined faces being adapted such that an angle of inclination thereof differs from that of the inclined face adjacent thereto; and a second light receiving unit having at least one sensor, said second light receiving unit receiving a light beam from said light projecting unit which is one of reflected and refracted by at least one of said plurality of inclined faces, absolute rotation position information of said scale relative to said light projecting unit and said second light receiving unit being obtained by the light reception of said second light receiving unit.

18. The apparatus according to claim 17, wherein said first light receiving unit has a plurality of sensors disposed correspondingly to the angles of inclination of said plurality of inclined faces.

19. The apparatus according to claim 17, wherein said first light receiving unit receives a light beam from said light projecting unit which has passed through the first area of said grating portion and a grating portion provided on a member discrete from said scale.

20. The apparatus according to claim 17, said grating portion being provided on the surface of said disc member over the entire circumference thereof.

21. The apparatus according to claim 17, said grating portion being provided over the entire circumference of one of an outer surface and an inner surface of said disc member.

22. A scale to which a light beam from a light projecting unit of a rotation information detecting apparatus is applied and in which a light beam created from the light-applied position is received by a first light receiving unit of said rotation information detecting apparatus, whereby relative rotation information is detected, said scale comprising:

a scale base body having a disc member and a grating portion provided on said disc member over an entire circumference thereof, said first light receiving unit receiving a light beam from said light projecting unit which has passed through a first area of said grating portion to obtain incremental relative rotation information between said scale base body, said light projecting unit and said first light receiving unit;

a plurality of index faces provided substantially over the entire circumference of said scale base body, on said index faces there being arranged at least three kinds of index faces differing in one of reflecting, refracting, and transmitting characteristics, a second light receiving unit in said rotation information detecting apparatus receiving a light beam from said light projecting unit which is one of reflected by, refracted by, and transmitted through at least one of said plurality of index faces, whereby absolute rotation position information of said scale base body relative to said light projecting unit and said second light receiving unit is obtained.

23. The scale according to claim 22, wherein each of said plurality of index faces differs in surface roughness from an adjacent index face.

24. The scale according to claim 22, wherein said plurality of index faces are adapted such that an angle of inclination of each of said plurality of index faces differs from an adjacent index face, and thereby has a different reflecting characteristic than the adjacent index face.

25. The scale according to claim 22, wherein said plurality of index faces are adapted such that reflectance of each of said plurality of index faces differs from an adjacent index face, and thereby has a different reflecting characteristic than the adjacent index face.

26. The scale according to claim 22, wherein each of said plurality of index faces differs in hue from an adjacent index face.

* * * * *

UNITED STATES PATENT AND TRADEMARK OFFICE
CERTIFICATE OF CORRECTION

PATENT NO. : 5,747,797            Page 1 of 2
DATED : May 5, 1998
INVENTOR(S) : Fujita It is certified that error appears in the above-indentified patent and that said Letters Patent is hereby corrected as shown below:    On the title page: Item

[56] References Cited:

FOREIGN PATENT DOCUMENTS

"4130221" should read --4-130221--.

[57] ABSTRACT:

Line 5, "fist" should read --first--.

COLUMN 1:

Line 22, "drawings," should read --drawings--; and
    Line 42, "of" should read --of the--.

COLUMN 2:

Line 6, "between," should read --between--; and
    Line 58, "as," should read --as--.

COLUMN 6:

Line 56, "of" should read --of the--;
    Line 57, "5 (a comma)" should read --5,--; and
    Line 62, "face" should read --faces--.

UNITED STATES PATENT AND TRADEMARK OFFICE
CERTIFICATE OF CORRECTION

PATENT NO. : 5,747,797  Page 2 of 2
DATED : May 5, 1998
INVENTOR(S) : Fujita

It is certified that error appears in the above-indentified patent and that said Letters Patent is hereby corrected as shown below:

COLUMN 8:

Line 35, "of" should read --of the--.

COLUMN 10:

Line 34, "types" should read --type--.

Signed and Sealed this

Fifth Day of January, 1999

Attest:

Attesting Officer      *Acting Commissioner of Patents and Trademarks*